United States Patent
Rutgers et al.

(10) Patent No.: US 9,634,571 B2
(45) Date of Patent: Apr. 25, 2017

(54) DRIVER DEVICE AND DRIVING METHOD FOR DRIVING A LOAD

(71) Applicant: PHILIPS LIGHTING HOLDING B.V., Eindhoven (NL)

(72) Inventors: Andrew Ulrich Rutgers, Eindhoven (NL); Reinhold Elferich, Aachen (DE)

(73) Assignee: PHILIPS LIGHTING HOLDING B.V., Eindhoven (NL)

( * ) Notice: Subject to any disclaimer, the term of this patent is extended or adjusted under 35 U.S.C. 154(b) by 13 days.

(21) Appl. No.: 14/436,217

(22) PCT Filed: Oct. 8, 2013

(86) PCT No.: PCT/IB2013/059201
§ 371 (c)(1),
(2) Date: Apr. 16, 2015

(87) PCT Pub. No.: WO2014/060899
PCT Pub. Date: Apr. 24, 2014

(65) Prior Publication Data
US 2015/0303817 A1 Oct. 22, 2015

Related U.S. Application Data

(60) Provisional application No. 61/715,345, filed on Oct. 18, 2012.

(51) Int. Cl.
*H02M 3/335* (2006.01)
*H02M 3/337* (2006.01)
(Continued)

(52) U.S. Cl.
CPC ...... *H02M 3/33569* (2013.01); *G01R 19/165* (2013.01); *H02M 3/337* (2013.01); *H05B 33/0815* (2013.01); *H02M 3/33561* (2013.01)

(58) Field of Classification Search
CPC .......... H02M 3/00; H02M 3/24; H02M 3/335; H02M 3/337
(Continued)

(56) References Cited

U.S. PATENT DOCUMENTS 5,675,480 A * 10/1997 Stanford ............... H02M 3/285
307/58
5,870,291 A 2/1999 Farrington et al.
(Continued)

FOREIGN PATENT DOCUMENTS

WO 0152547 A1 7/2001
WO 2005112238 A2 11/2005
(Continued)

OTHER PUBLICATIONS

Ya Liu; "High Efficiency Optimization of LLC Resonant Converter for Wide Load Range", Master of Science in Electrical Engineering, Dec. 4, 2007, Blacksburg, VA, pp. 1-119.

*Primary Examiner* — Rajnikant Patel

(57) ABSTRACT

The present invention relates to a driver device (10) for driving a load (18), comprising input terminals (14, 16) for connecting the driver device (10) to a voltage supply (12) and for receiving an input voltage (V10) from the voltage supply (12), at least one output terminal for connecting the driver device (10) to the load (18), an electromagnetic converter unit (24) for converting a drive voltage to an output voltage (V20) for powering the load (18), two controllable switches (20, 22) connected to the input terminals (14, 16) for providing a variable voltage as the drive voltage to the electromagnetic converter unit (24), and a control unit (28) for controlling a first of the controllable switches (20, 22) on the basis of an electrical signal (V12) measured at a member of the electromagnetic converter unit (24) and a threshold level (40, 52) and for controlling a second of the controllable switches (20, 22) on the basis of a control (Continued)

parameter (50, $t_{OFF}$) set to a value that the on-times of the controllable switches (20, 22) have independent durations.

18 Claims, 7 Drawing Sheets

(51) Int. Cl.
*G01R 19/165* (2006.01)
*H05B 33/08* (2006.01)

(58) Field of Classification Search
USPC ....... 363/16–17, 25, 21.02, 97, 98; 323/266, 323/271, 272, 282–289
See application file for complete search history.

(56) References Cited

U.S. PATENT DOCUMENTS

| | | | |
|---|---|---|---|
| 6,731,524 B2 * | 5/2004 | Elek | H02M 1/34 323/207 |
| 6,934,166 B2 * | 8/2005 | Vinciarelli | H02M 1/088 363/17 |
| 7,145,786 B2 * | 12/2006 | Vinciarelli | H02M 1/088 363/17 |
| 7,313,004 B1 | 12/2007 | Yang et al. | |
| 8,400,129 B2 * | 3/2013 | Ouyang | H02M 3/158 323/271 |
| 8,749,216 B2 * | 6/2014 | Li | H02M 3/156 323/283 |
| 8,773,090 B2 * | 7/2014 | Ouyang | H02M 3/1588 323/271 |
| 2006/0098464 A1 | 5/2006 | Osaka et al. | |
| 2008/0043494 A1 | 2/2008 | Jiao et al. | |
| 2008/0198638 A1 | 8/2008 | Reinberger et al. | |
| 2008/0266908 A1 | 10/2008 | Halberstadt | |
| 2011/0164437 A1 | 7/2011 | Sun et al. | |

FOREIGN PATENT DOCUMENTS

| | | |
|---|---|---|
| WO | 2009098640 A1 | 8/2009 |
| WO | 2011039678 A1 | 4/2011 |
| WO | 2011055285 A1 | 5/2011 |

* cited by examiner

DRIVER DEVICE AND DRIVING METHOD FOR DRIVING A LOAD

CROSS-REFERENCE TO PRIOR APPLICATIONS

This application is the U.S. National Phase application under 35 U.S.C. §371 of International Application No. PCT/IB13/059201, filed on Oct. 8, 2013, which claims the benefit of U.S. Provisional Patent Application No. 61/715,345, filed on Oct. 18, 2012. These applications are hereby incorporated by reference herein.

FIELD OF THE INVENTION

The present invention relates to a driver device and a corresponding driving method for driving a load. Further, the present invention relates to a light apparatus.

BACKGROUND OF THE INVENTION

In the field of LED drivers for offline applications, solutions are demanded to drive the LEDs over a large power range with a high reliability, in particular to drive the LEDs at very low power precisely and having a low sensitivity to external interferences and noise.

In the field of LED drivers LLC converters are commonly known for driving LEDs. The LLC converter controls the output power provided to the load by switching two controllable switches and by providing an alternating input voltage to an electromagnetic transformer. The energy transferred by the LLC converter is related to the energy change in a capacitor between the two switching states. The energy provided to the load is controlled by switching the controllable switches.

U.S. 2011/0164437 A1 discloses an LLC converter, wherein the output power is controlled by varying the duty cycle of the controllable switches. Alternatively, the output power of the LLC converters is controlled by changing the switching frequency of the controllable switches as disclosed by U.S. Pat. No. 7,313,004 B1.

A further method to control the LLC converter is to trigger the switching actions of the controllable switches on the basis of the transformer voltage. The switching actions are triggered when the transformer voltage exceeds a threshold voltage and causing the switches to reverse when the transformer voltage drops below a second threshold voltage. The output power provided by the threshold-controlled LLC converter can be controlled by changing the input voltage provided to the controllable switches and by changing the threshold voltages. The change of the input voltage results in a change of the frequency of the controllable switches and adjusting the threshold voltages linearly with the change in the input voltage may result in an approximately constant output power. The voltage-threshold control of the LLC converters allows a better linearity than a frequency control and provides a constant output power for powering the load.

The disadvantage of the threshold-controlled LLC converters is that they are complicated and do not provide a robust low power operation. Since the threshold levels are set above the input voltage for providing low power to the load, the transformer voltage exceeds the threshold for a very short time resulting in a high switching frequency of the controllable switches. Noise or a variation of the threshold level can change the switching points of the controllable switches slightly such that no power will be delivered to the load which may cause random disruption of the output power. The disruption caused by the noise can also result in an oscillation causing an inconsistent output power. Further, the known LLC converter provide a reduced output control linearity.

SUMMARY OF THE INVENTION

It is an object of the present invention to provide an improved driver device and a corresponding driving method for driving a load, in particular a current controlled load such as an LED unit, having an improved output control linearity and providing a reliable low power operation with low technical effort. Further, it is an object of the present invention to provide a corresponding light apparatus.

According to one aspect of the present invention, a driver device for driving a load is provided, comprising:
input terminals for connecting the driver device to a voltage supply for receiving an input voltage from the voltage supply,
at least one output terminal for connecting the driver device to the load,
an electromagnetic converter unit for converting a drive voltage to an output voltage for powering the load,
two controllable switches connected to the input terminals for providing a variable voltage as the drive voltage to the electromagnetic converter unit, and
a control unit for controlling a first of the controllable switches on the basis of an electrical signal measured at a member of the electromagnetic converter unit and a threshold level and for controlling a second of the controllable switches on the basis of a control parameter set to a value that the on-times of the controllable switches have independent durations.

According to another aspect of the present invention, a driver device for driving a load is provided, comprising:
input terminals for connecting the driver device to a voltage supply and for receiving an input voltage,
at least one output terminal for connecting the driver device to the load,
an electromagnetic converter unit for converting a drive voltage to an output voltage for powering the load, and
a measurement device including a coupling member coupled to the electromagnetic converter unit, a first measurement circuitry having a full bridge rectifier connected to the coupling member for measuring a first voltage, and a second measurement circuitry having a half bridge rectifier connected to the coupling member for measuring a second voltage.

According to still another aspect of the present invention, a driver device for driving a load is provided, comprising:
input terminals for connecting the driver device to a voltage supply and for receiving an input voltage from the voltage supply,
at least one output terminal for connecting the driver device to the load,
an electromagnetic converter unit for converting a drive voltage to an output voltage for powering the load,
two controllable switches connected to the input terminals for providing a variable voltage as the drive voltage to the electromagnetic converter unit, and
a single rectifier unit connected to the electromagnetic converter unit, wherein the single rectifier unit is adapted to provide a half wave rectified voltage as the output voltage to the load.

According to another aspect of the present invention, a driving method for driving a load is provided, wherein the driving method comprises the steps of:

providing a variable voltage as a drive voltage to an electromagnetic converter unit by means of two controllable switches, converting the drive voltage to an output voltage by means of the electromagnetic converter unit for powering the load, controlling a first of the controllable switches on the basis of an electrical signal measured at a member of the electromagnetic converter unit and a threshold level and controlling a second of the controllable switches on the basis of a control parameter set to a value that the on-times of the controllable switches have independent durations.

Preferred embodiments of the invention are defined in the dependent claims. It should be understood that the claimed method has similar and/or identical preferred embodiments as the claimed device and as defined in the dependent claims.

The present invention is based on the idea to set the on-time of the controllable switches to different durations in combination with threshold control to achieve a very low output power. Since the converter is controlled on the basis of the primary voltage-threshold control for one of the controllable switches, the linearity of the control can be achieved and a constant output power or current can be reached. Due to the independent on-time durations of the controllable switches, a precise and reliable output power can be provided to the load having a large power range and can be reduced to a very low power level. The asymmetric on-time duration of the controllable switch can achieve a deep dimming operation and provides a stable and reliable output power to the load, which is less sensitive to noise, The present invention is further based on the idea to measure the output voltage of the driver device precisely for the different half waves of the output voltage. Since the output power is only provided by one of the output winding during one of the half waves of the output voltage, the measurement device has to measure the output voltage independently for the different half waves in the case of asymmetric triggering. To distinguish the different half waves of the output voltage from each other, one of the measurement circuitry has a full bridge rectifier and the second measurement circuitry has a half bridge rectifier to measure the output power precisely.

The present invention is further based on the idea to reduce the technical effort in particular for asymmetric operation by using only one single rectifier unit which is adapted to provide a half wave rectified voltage as the output voltage to the load. By providing a half wave rectified voltage to the load, a highly-linear output current response to the changing of the manipulating input variable can be achieved. Further, an expensive current feedback circuitry can be omitted to achieve a smaller and cheaper converter unit.

In a preferred embodiment, the control unit is adapted to switch the controllable switches alternating, wherein an upper switch of the controllable switches is assigned to a high voltage level and a lower switch of the controllable switches is assigned to a low voltage level to provide the alternating voltage or a low voltage to the electromagnetic converter unit. This is a possibility to provide an alternating voltage to the electromagnetic converter unit for controlling the output power with low technical effort.

In a preferred embodiment, the control parameter is a second threshold voltage, wherein the threshold voltages are set to different absolute values. This is a simple possibility to achieve asymmetric on-time durations of the controllable switches and to operate the driver device stably at low power.

In a further embodiment, the control parameter is the on-time duration of the second controllable switch, which is preferably set to a predefined value. Since one of the controllable switches is time-controlled, the influence of noise on the switching of the controllable switches and the sensitivity to noise is reduced. A short time controlled period increases the magnitude of the primary voltage which is compared to a threshold to generate the first switching signal, further reducing the sensitivity.

According to a further embodiment, the first threshold voltage is an upper threshold level for controlling the upper controllable switch and wherein the on-time duration of the lower controllable switch is controlled and preferably set to the predefined value. The time controlled lower controllable switch can avoid the premature switching of the lower controllable switch.

In a further embodiment, the first threshold voltage is a lower threshold level for controlling the lower controllable switch and wherein the on-time duration of the upper controllable switch is controlled and preferably set to the predefined value. The time controlled on-time duration of the upper controllable switch can avoid the premature switching of the upper controllable switch.

In a further embodiment, the driver device comprises a measurement device including a coupling member coupled to the electromagnetic converter unit, a first measurement circuitry having a full bridge rectifier connected to the coupling member for measuring a first voltage and a second measurement circuitry in a half bridge rectifier connected to the coupling member for measuring a second voltage. This is a possibility to measure the output power precisely, since the output power is only provided to the load during one half wave of the output voltage and can be easily detected in the asymmetric mode by means of the AC coupled full wave rectifier and the half wave rectifier.

In a further embodiment, the coupling member comprises a winding coupled to the electromagnetic converter unit. This is a simple solution to detect the electrical energy converted by the electromagnetic converter unit with low technical effort.

In a further embodiment, the electromagnetic converter unit comprises a primary winding and a first and a second secondary winding for providing the output voltage to a load, wherein the first voltage measured by the first measurement circuitry corresponds to a combination of secondary voltages provided by the first and the second secondary winding and wherein the second voltage measured by the second measurement circuitry corresponds to a secondary output voltage provided by the first secondary winding. By means of this measurement unit, the output power can be precisely measured also for asymmetric operation, since the output voltage during each half wave can be measured with low technical effort.

In a further preferred embodiment, the measurement device is adapted to determine a second output voltage provided by the secondary winding on the basis of the first voltage and the second voltage. This is a simple possibility to determine the voltages provided by the two secondary windings.

In a further preferred embodiment, the detection device is connected to a neutral level of a primary side of the electromagnetic converter unit. This provides the possibility of primary side sensing of the output power independent from the secondary side, since the measurement circuitry is connected to a ground pin of the primary side of the electromagnetic converter unit.

In a further preferred embodiment the rectifier unit is a half bridge rectifier unit for providing the output voltage to the load for powering the load. This is a simple solution to provide a half wave rectified voltage as the drive voltage to the load.

In a further preferred embodiment the control unit comprises a time control device connected to at least one of the input terminals for controlling the on-time duration of the second controllable switch on the basis of the input voltage. This provides an analogue feed forward control to reduce the ripple of the output current with a minimum of components. The feed forward control is preferably adapted to increase the threshold level when the input voltage is decreasing and to decrease the threshold level when the input voltage is increasing.

As mentioned above, the present invention provides an improved driver device for driving a load, wherein due to the asymmetric on-time durations of the controllable switches based on threshold control a dimming to very low power can be achieved wherein due to the different on-time durations, the output power is stable since the driver device is less sensitive to noise causing premature switching. Further, the present invention provides a driver device having a measurement unit for measuring the different half waves of the output voltage by means of a full bridge rectifier and a half bridge rectifier to determine the output power provided to the load independent of the secondary windings of the electromagnetic converter unit. Finally, a driver device is provided which can provide a more linear output behavior with low technical effort, since a full bridge rectifier is omitted.

Hence, a precise and reliable and linear control of the electrical power provided to the load can be achieved with low technical effort in particular to very low power levels.

BRIEF DESCRIPTION OF THE DRAWINGS

These and other aspects of the invention will be apparent from and elucidated with reference to the embodiment(s) described hereinafter. In the following drawings.

DETAILED DESCRIPTION OF THE INVENTION

Figure 1:
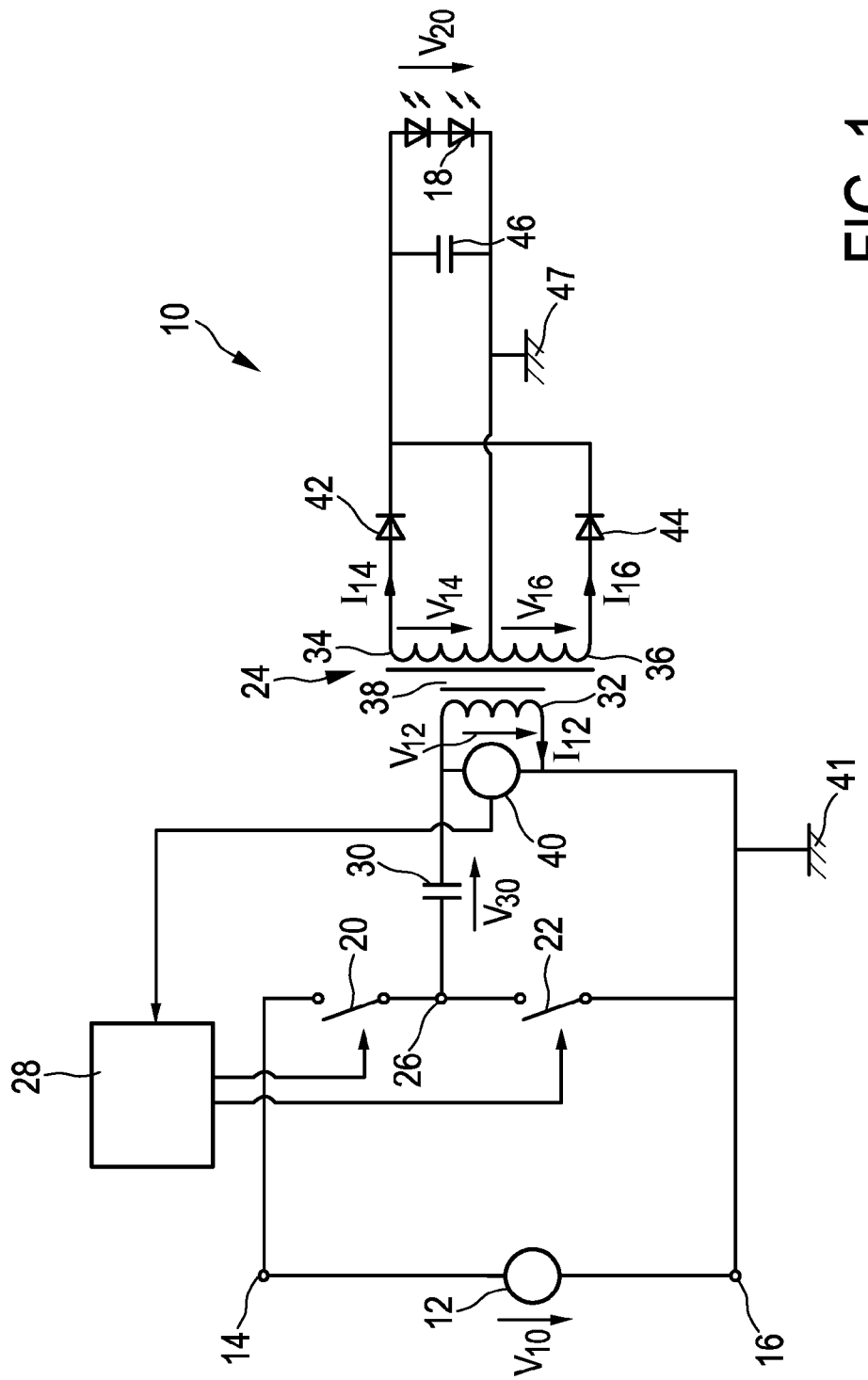
FIG. 1 shows a schematic block diagram of a driver device for driving a load.

FIG. 1 shows a schematic block diagram of a driver device generally denoted by 10. The driver device 10 is connected to a voltage supply 12 which provides a supply voltage V10. The driver device 10 is connected to the voltage supply 12 by means of the input terminals 14, 16.

The driver device 10 converts the input voltage V10 to an output voltage V20 for powering a load 18, which is in the particular embodiment shown in FIG. 1 formed as an LED unit 18. The driver device 10 is preferably an LLC converter.

The driver device 10 comprises two controllable switches 20, 22 and an electromagnetic converter unit 24 for converting the input voltage V10 to the output voltage V20 for powering the load 18. The input voltage V10 is a direct voltage or a rectified voltage rectified by means of a rectifier (not shown) connected to an AC voltage supply. The controllable switches 20, 22 are connected in series to each other and are connected in parallel to the input terminals 14, 16. The controllable switches 20, 22 are connected to each other to form a half bridge, wherein a node 26 between the controllable switches 20, 22 forms an output terminal of the half bridge. The driver device 10 comprises a control unit 28 for controlling the controllable switches 20, 22. The control unit 28 switches the controllable switches 20, 22 alternating to provide an alternating voltage to the node 26 and to the electromagnetic converter unit 24 as explained below.

The node 26 of the half bridge is connected to the electromagnetic converter unit 24. The electromagnetic converter unit 24 is formed of an input capacitor 30 and a transformer comprising a primary winding 32, two secondary windings 34, 36 and an electromagnetic coupling member 38 for coupling the primary winding 32 and the second windings 34, 36. The primary winding 32 and the input capacitor 30 are connected in series to each other, wherein the input capacitor 30 may be connected to the node 26 as shown in FIG. 1 or connected to the input terminal 16. The electromagnetic converter unit 24 comprises a measurement device 40 for measuring a primary voltage V12 at the primary winding 32 or a capacitor voltage V30 at the input capacitor 30. Alternatively, the measurement device 40 may be connected to a series connection of the primary winding 32 and an additional inductance (not shown) for measuring a corresponding voltage or the measurement unit may be provided for measuring a primary current I12 in the primary winding 32. The measurement device 40 is connected to the control unit 28 for providing a corresponding measurement signal to the control unit 28 for controlling the controllable switches 20, 22. In the case shown in FIG. 1, the primary winding 32 is connected to a primary ground 41. Alternatively, the input capacitor 30 may be connected to the primary ground 41 and the primary winding 32 may be connected to the node 26. The primary voltage V12 and the primary current I12 in the primary winding 32 is transformed to two secondary voltages V14, V16 and two secondary currents I14, I16 provided by the secondary windings 34, 36, respectively. The secondary windings 34, 36 are each connected via a diode 42, 44 and an output capacitor 46 and to the load 18 for providing a direct output current and a direct voltage as the output voltage V20 to the load 18 for powering the load. The secondary ground 47 can be either connected to or isolated from the primary ground 41.

The controllable switches 20, 22 are switched alternatively to provide an alternating voltage to the electromagnetic converter unit 24. The output voltage V20 and the secondary currents I14, I16 depend on the wave form of the primary voltage V12 and can be controlled by a switching frequency of the controllable switches 20, 22 and a duty cycle of an on-time of the controllable switches 20, 22. The control unit 28 receives a measurement signal from the measurement device 40 and controls the controllable switches 20, 22 on the basis of the measured signal, i.e. the primary voltage V12 or the capacitor voltage.

Figure 2:
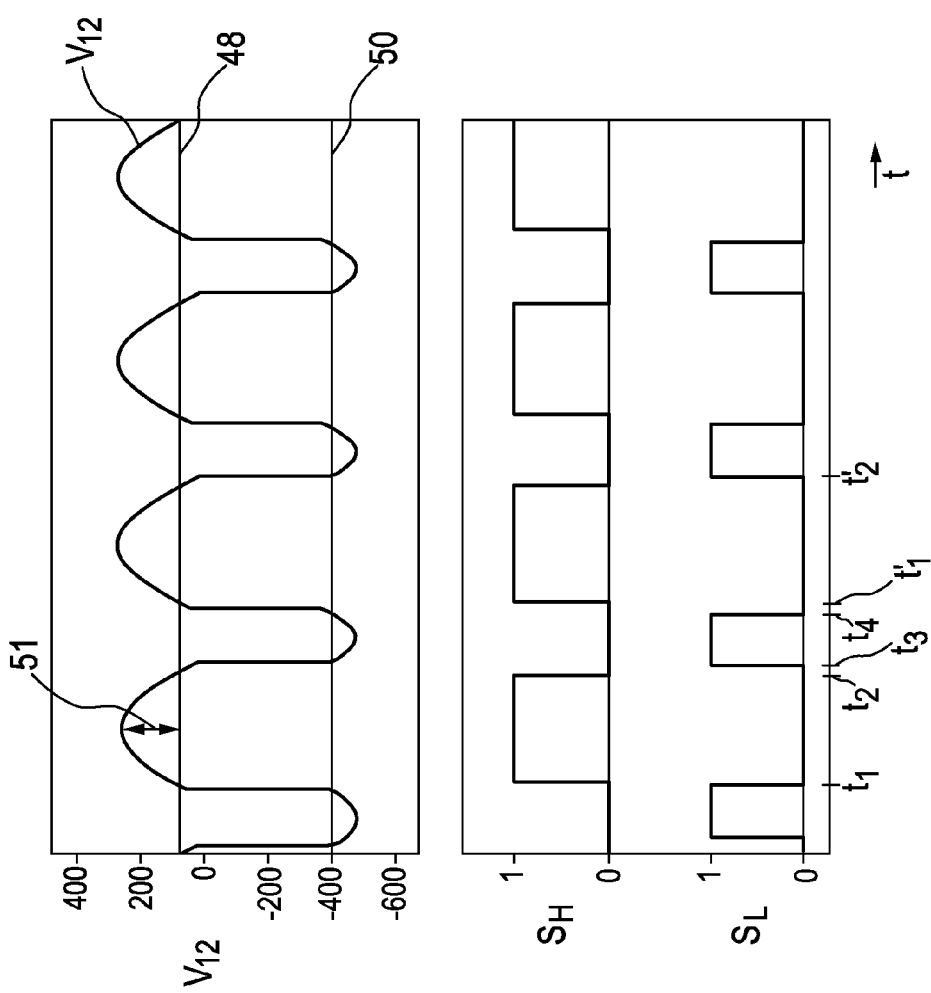
FIG. 2 shows a diagram illustrating an asymmetric control of the driver device on the basis of two threshold levels.

FIG. 2 shows a diagram illustrating the on-time of the controllable switches 20, 22 by means of the respective control signals $S_H$, $S_L$ and the resulting measurement signal provided by the measurement unit 40, in this case the primary voltage V12. The controllable switches 20, 22 are voltage-controlled and switched on the basis of the primary voltage V12 and an upper threshold level 48 and a lower threshold level 50. At t1, the upper controllable switch 20 is turned on. This leads to an increase of the primary voltage V12 until a peak value 51 is reached followed by a decrease of the primary voltage V12. At t2 the primary voltage V12 drops below the upper threshold level 48 and the upper controllable switch 20 is switched off. A predefined time later, the lower controllable switch 22 is switched on at t3. This leads to a further dropping of the primary voltage V12 until a peak value is reached followed by an increase of the primary voltage V12 until the primary voltage V12 reaches the lower threshold level 50 at t4. A subsequent predefined time later, the upper controllable switch 20 is turned on again at t1'. When the primary voltage V12 exceeds the lower threshold level 50, the lower controllable switch 22 is switched off again at t4. Hence, the on-time of the controllable switches 20, 22 and the duty cycle of the primary voltage V12 can be voltage-controlled by setting the threshold levels 48, 50 to certain values.

Since the threshold levels 48, 50 are set to different absolute values, the on-time of the controllable switches 20, 22 have different durations. In this case, the upper threshold level 48 is set to about +100 V and the lower threshold level is set to about −400 V as shown in FIG. 2. This asymmetric setting of the threshold levels 48, 50 leads to an asymmetric triggering of the controllable switches 20, 22, whereby a lower electrical power can be provided to the load 18. Further, the output power is more linear connected to the settings of the threshold levels 48, 50 and the technical effort to control the controllable switches 20, 22 is reduced.

Figure 3:
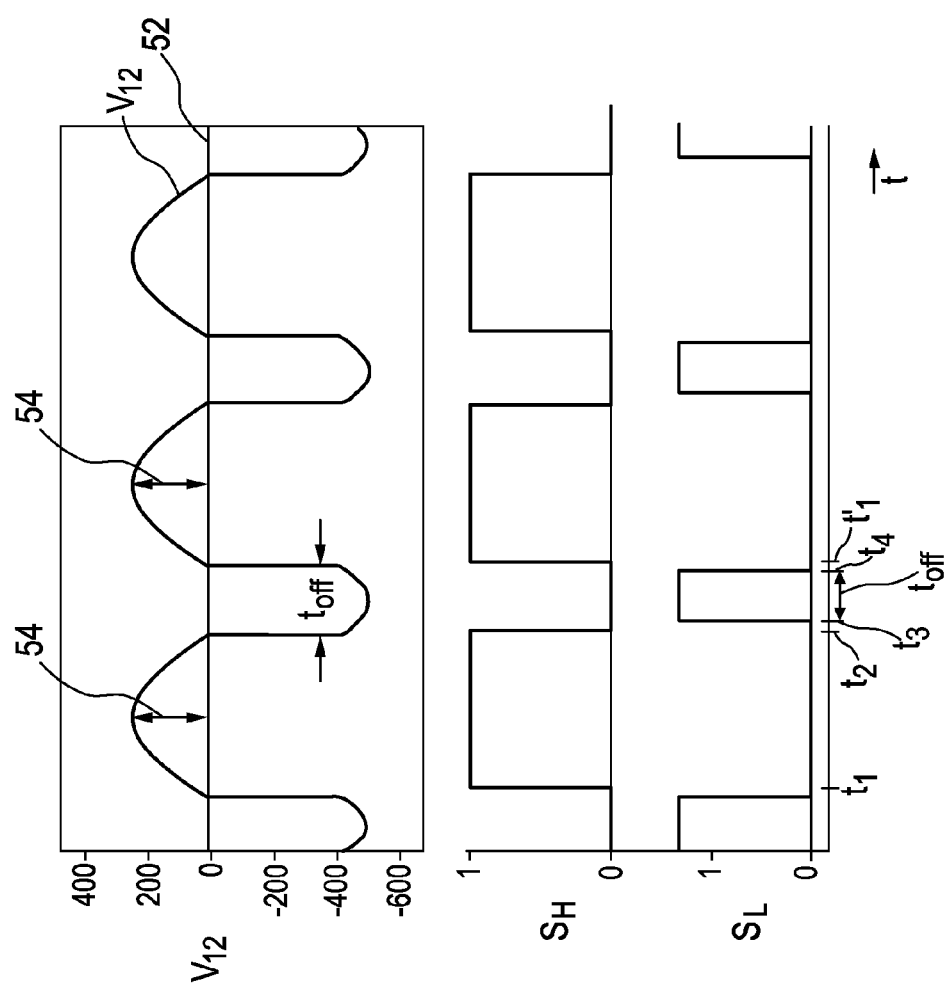
FIG. 3 shows a diagram illustrating the asymmetric control of the driver device on the basis of one threshold level and an on-time control.

FIG. 3 shows a diagram illustrating the on-time of the controllable switches 20, 22 by means of the respective control signals $S_H$, $S_L$ and the resulting measurement signal, in this case the primary voltage V12. The controllable switches 20, 22 are controlled on the basis of the primary voltage V12, one threshold level 52 and an on-time control of one of the controllable switches 20, 22.

The on-time of the upper controllable switch 20 is controlled on the basis of the primary voltage V12 and the threshold level 52 as described above. The upper controllable switch 20 is turned on at t1. The primary voltage V12 increases until a peak voltage 54 is reached and drops again below the threshold level 52 at t2. When the primary voltage V12 drops below the threshold level 42, the upper controllable switch 20 is switched off at t2 and the lower controllable switch 22 is switched on a predefined time later at t3. After a predefined or set time $t_{OFF}$, the lower controllable switch 22 is switched off at t4.

Hence, the operation of the controllable switches 20, 22 is controlled on the basis of one threshold level 52 and the on-time duration of one of the controllable switches 20, 22. And the delay between the turning off of one switch and turning on of the other (dead time). In this case shown in FIG. 3, the upper controllable switch 20 is voltage-controlled by the threshold level 52 and the on-time duration of the lower controllable switch 22 is time-controlled. In an alternative embodiment, the lower controllable switch 22 is voltage-controlled on the basis of a lower threshold level and the on-time duration of the upper controllable switch 20 is time-controlled.

One important value to control the controllable switches 20, 22 and the driver device 10 is the peak voltage shown in FIG. 3 at 54, which is the difference between the peak of the primary voltage V12 and the threshold level 52. If the peak voltage 54 is very low, noise of the primary voltage V12 may cause a premature switching of the controllable switches 20, 22 and will cause a not stable output power at low power levels. Since the on-time of one of the controllable switches 20, 22 (in this case the lower controllable switch 20) is time-controlled, the switching is not dependent on the peak voltage during the on-time of the time-controlled controllable switch 22. Further, the asymmetric triggering and the asymmetric on-time of the controllable switches 20, 22 increases the peak voltage 54 so that the asymmetric triggering improves the stability of the driver device 10.

Hence, an asymmetric triggering of the controllable switches 20, 22 can be achieved by either two threshold levels 48, 50 set to different absolute values in an asymmetric fashion or by means of one threshold level 52 and an on-time control of the respective other controllable switch 20, 22. This leads to a more stable output power, in particular for a very low power levels.

Figure 4:
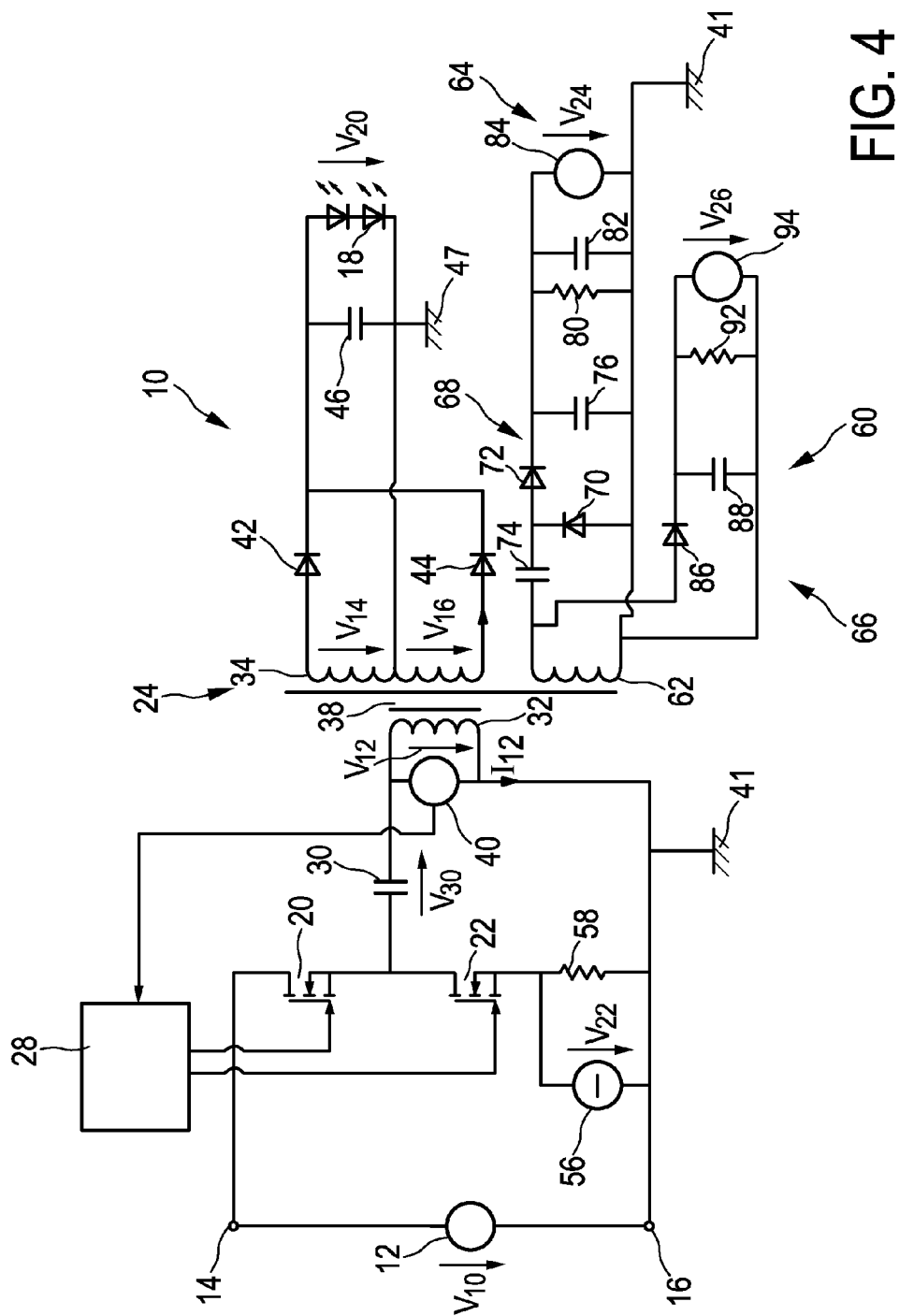
FIG. 4 shows the driver device of FIG. 1 including a measurement unit for measuring the output power.

FIG. 4 shows the driver device 10 including a measurement device for measuring the output voltage V20 on the basis of primary side sensing. Identical elements are denoted by identical reference numerals, wherein here merely the differences are explained in detail.

The driver device 10 comprises a current sensor 56, which is connected between the lower controllable switch 20 and the primary ground 41.

The driver device 10 further comprises a measurement device 60, which is coupled to the coupling member 38 of the electromagnetic converter unit 24. The measurement device 60 comprises a winding 62, which is coupled to the coupling member 38 of the electromagnetic converter unit 24. The winding 62 is connected to the primary ground 41. The measurement device 60 comprises a first measurement circuitry 64 and a second measurement circuitry 66. The first measurement circuitry 64 is connected to the winding 62 and comprises an ac coupled rectifier 68 formed of two diodes 70, 72 and a capacitor 74. The rectifier 68 is connected to the winding 62. A capacitor 76 and a resistor 80 are connected in parallel to the rectifier 68. The rectifier 68 is connected to a voltmeter 84 for measuring a rectified voltage V24 provided by the rectifier 68.

The second measurement circuitry 66 is connected to the winding 62 and comprises a rectifier 86 formed by one diode 86, which is connected in parallel to a capacitor 88 and to a resistor 92 and a voltmeter 94 for measuring a rectified voltage V26 provided by the rectifier 86.

Since the first measurement circuitry 64 comprises the rectifier 68 including the two diodes 70, 72, a signal related to the full wave amplitude voltage at the winding 62 is measured by the voltmeter 84 and since the second measurement circuitry 66 comprises the rectifier 86 including the single diode 86, a signal proportional to the amplitude of the voltage at only one of the two secondary windings 36, 34 is measured at the winding 62 by the voltmeter 94. Since V26 corresponds to one half wave of the voltage of the winding 62, V26 corresponds to one of the secondary voltages V14, V16 of the secondary windings 34, 36. Since V24 corresponds to both half waves of the voltage of the winding 62, V24 corresponds to the sum of the secondary voltages V14, V16 of the secondary windings 34, 36 and is proportional to the ratio between the secondary windings 34, 36 and the winding 62. By subtracting V26 from V24, the respective other secondary voltage V14, V16 of the secondary windings 34, 36 can be found. The additional measurement for measuring the voltages V14, V16 of both secondary windings 34, 36 is necessary for an asymmetric operation, since only one of the secondary windings 34, 36 provides electrical power to the load 18.

An additional benefit of the first and the second measurement circuitry 66, 68 is that the voltage drop across the diode 72 and the diode 86 are cancelled out when the two measurements of the voltages 24, 26 are subtracted such that the measurement of one of the secondary windings 34, 36 is more precise.

As with other threshold controllers, these methods could also be applied to threshold control measuring across the capacitor voltage and as opposed to the transformer voltage as illustrated here. In the case of capacitor voltage operation, the thresholds have a low overhead voltage at high power, wherein noise is less relevant.

Figure 5:
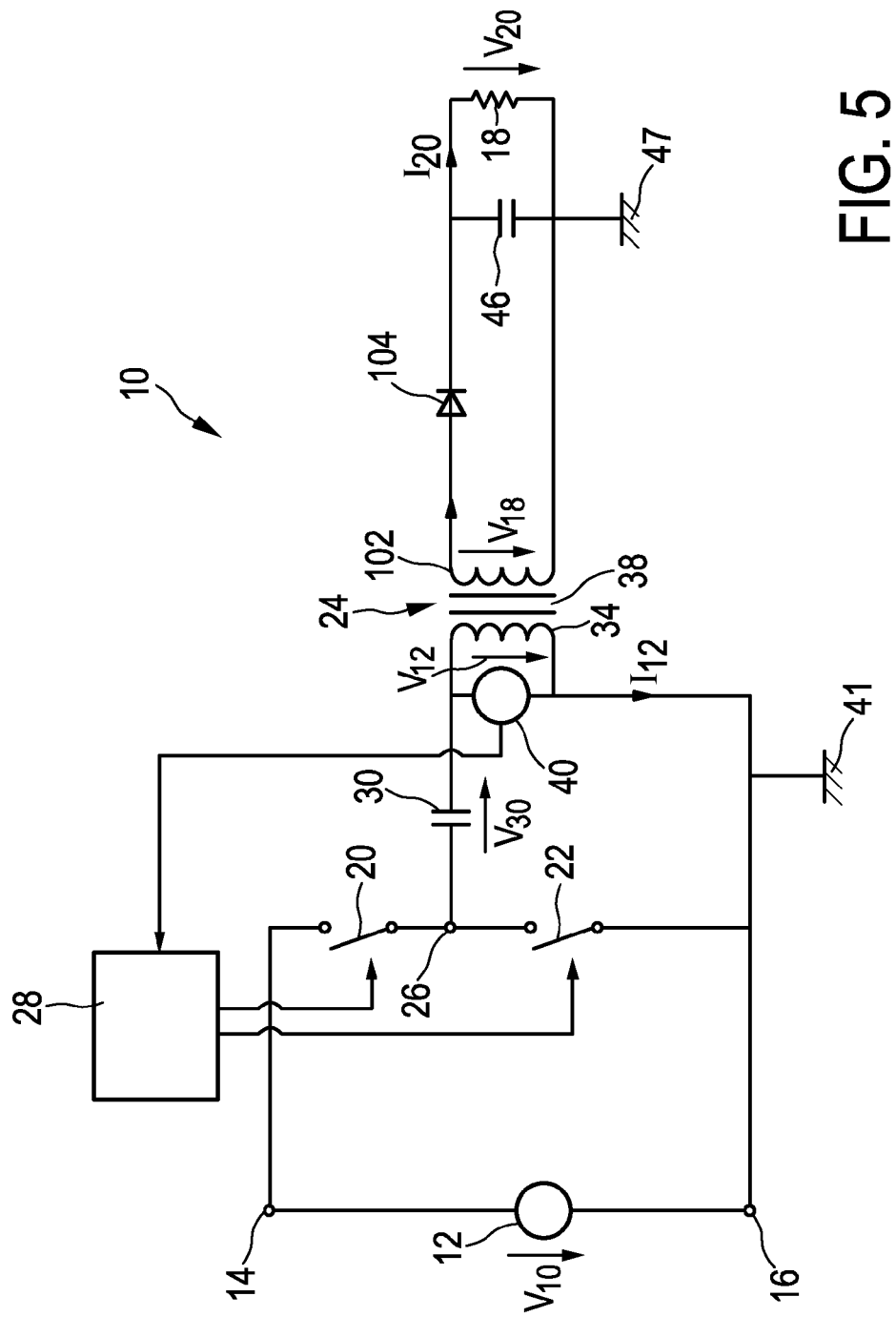
FIG. 5 shows an alternative driver device providing a half wave rectified output voltage.

FIG. 5 shows an alternative embodiment of the driver device 10. Identical elements are denoted by identical reference numerals, wherein here merely the differences are explained in detail.

The electromagnetic converter unit 24 comprises the primary winding 34, which is coupled by means of the coupling member 38 to one single output winding 102. The measurement unit 40 may be provided to measure the primary voltage V12, the capacitor voltage V30, the primary current 112 or a voltage across an additional inductance (not shown) and the primary winding 34 as explained above. The output winding 102 is connected via a rectifier device 104 to the load 18. The output capacitor 46 is connected in parallel to the load 18. The rectifier device 104 is a half wave rectifier device and preferably formed by a diode. The rectifier unit 104 converts a secondary voltage V18 provided by the secondary winding 102 to a half wave rectified voltage, which is provided as the output voltage V20 to the load 18, which is preferably a light unit 18 comprising one or more LEDs.

Since the rectifier device 104 merely provides the positive or the negative half wave of the secondary voltage V18 to the load 18, the output current 120 and, therefore the output power is proportional to the on-time duration of the control switches 20, 22. This provides a linear dependency of the output power from the control parameter, i.e. the on-time duration of the lower controllable switch 22 or the lower threshold level 50.

The electromagnetic converter unit 24 comprises only the single secondary winding 102, which reduces the amount of components and provides the desirable highly linear output response. Such output circuitry comprising the single secondary winding 102 and the single half wave rectifier device 104 is applicable for an asymmetric operation of the electromagnetic converter unit 24, i.e. different on-time durations of the controllable switches 20, 22. Since only one of the half waves of the secondary voltage V18 is provided as the output voltage V20 to the load 18, the electrical output current 120 is linearly dependent on the on-time duration of one of the controllable switches 20, 22.

FIG. 5 shows a driver device comprising an electromagnetic converter unit 24 having isolated windings 34, 102. Alternatively, the electromagnetic converter unit 24 may have non-isolated windings.

Figure 6:
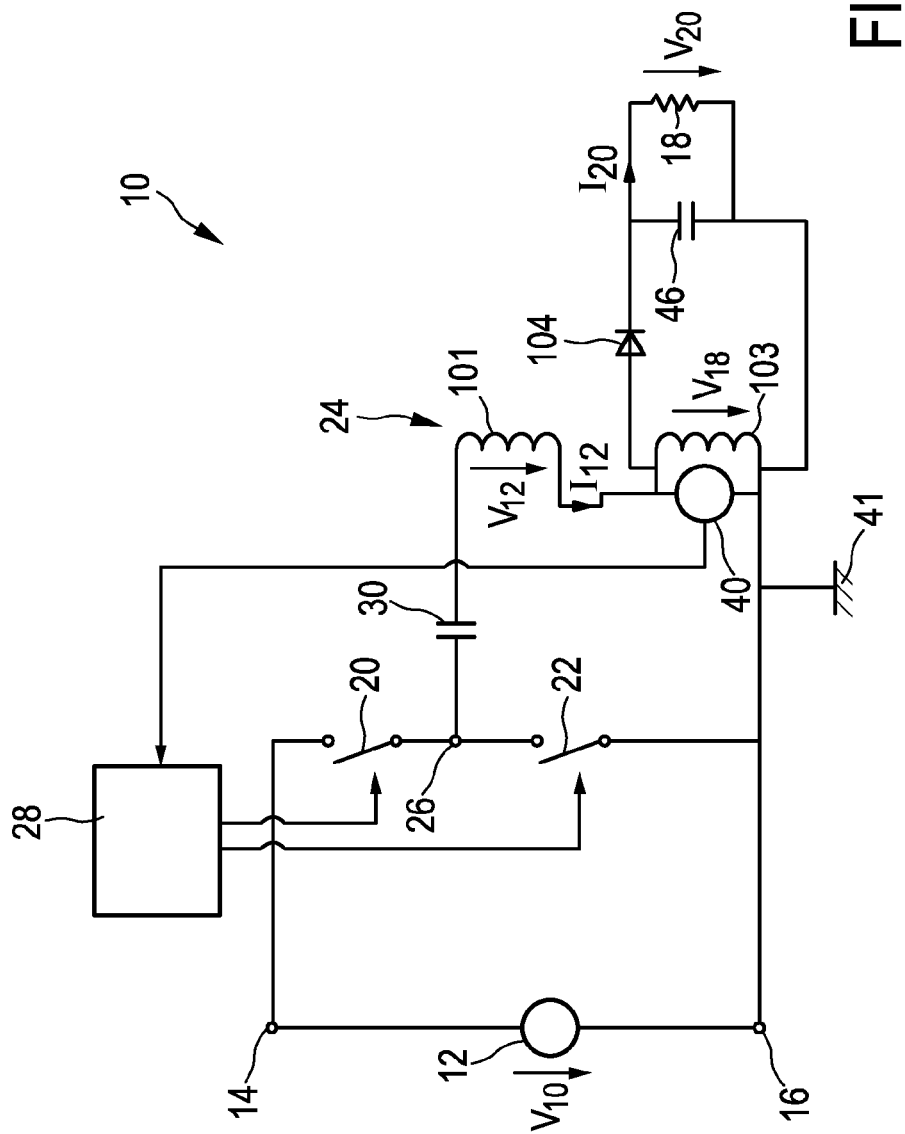
FIG. 6 shows an alternative embodiment of the driver device of FIG. 5.

FIG. 6 shows an alternative embodiment of the driver device comprising a non-isolated electromagnetic converter unit 24 and providing a half wave rectified voltage as the output voltage V20 to the load 18.

A primary inductance 101 and a single secondary inductance 103 are electrically connected in series to each other and in series to the input capacitor 30 between the node 26 and the primary ground 41.

The single secondary inductance 103 provides a secondary voltage V18, which is rectified by means of the half wave rectifier device 104 providing the half wave rectified voltage as the output voltage V20 to the load 18. Hence, the output current 120 and the electrical output power corresponds to the respective positive or negative half waves of the secondary voltage V18 and is linearly dependent on the on-time duration of one of the controllable switches 20, 22 in line with the embodiment shown in FIG. 5. The primary inductance 101 and the secondary inductance 103 act as voltage divider so that the output voltage V20 is different from the input voltage V10.

The measurement unit 40 my be provided to measure the primary voltage V12, the capacitor voltage V30, the primary current 112 or a voltage across the primary inductance 101 and the secondary inductance 103. The embodiments of the driver device 10 shown in FIGS. 5 and 6 can be implemented with low technical effort by using simple electronics such as comparators and latches or timer devices. In case of the implementation of a dead time between the on-times of the controllable switches 20, 22 to ensure a zero-voltage switching would be slightly more complex.

Figure 7:
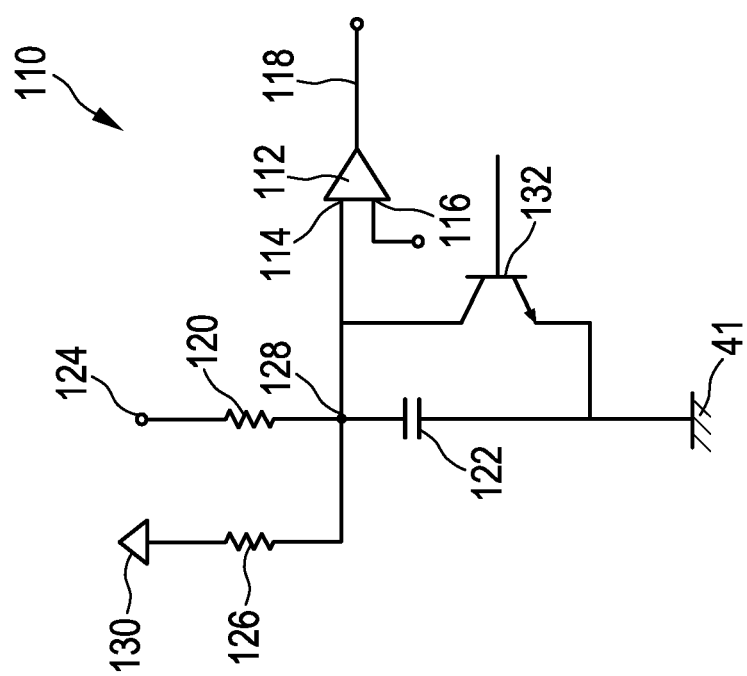
FIG. 7 shows a time control unit for controlling the on-time duration of one of the control switches of the driver device.

FIG. 7 shows a time control unit 110 for providing a feed-forward of the input voltage V10 to the output voltage V20.

The time control unit 110 comprises a comparator 112 having an input terminal 114 and a reference terminal 116 and an output terminal 118. The comparator device 112 compares a voltage at the input terminal 114 to a reference voltage at the reference terminal 116 and provides a drive signal at the output terminal 118 to the control unit 28 or one of the controllable switches 20, 22 to set the on-time duration of the one of the controllable switches 20, 22, i.e. the time controlled switch 20, 22.

The time control unit 110 further comprises a first resistor 120, a capacitor 122 connected in series to each other, wherein the first resistor 120 is connected to an input terminal 124, which is preferably connected to the input terminal 14. The capacitor 122 is connected to the primary ground 41. A second resistor 126 is connected to a node 128 between the first resistor 120 and the capacitor 122. The second resistor 126 is further connected to an input terminal 130 connected to the measurement device 40 or the control unit 28 for receiving a voltage proportional to the measured parameter V12, V30, I12 in the resonant circuit and to trigger a switching of the respectively controlled controllable switch 20, 22 by variation of the input voltage 14 and the state of the resonant circuit.

A controllable switch 132 is connected in parallel to the capacitor 122 for discharging the capacitor 122 and for resetting the time control unit 110. In some embodiments the capacitor 122 could be replaced with a resistor and no controllable switch 132 is required.

Since the first resistor 120 is connected to the voltage supply 12, the first resistor 120 charges the capacitor 122 and decreases the charge time of the capacitor 122 as the input voltage V10 increases. Hence, the rise time of the voltage at the node 28 and the control terminal 114 of the comparator device 112 is directly dependent on the input voltage V10. Hence, the on-time duration of the time controlled controllable switch 20, 22 is directly dependent on the input voltage V10. Therefore, a feed-forward of the input voltage V10 can be implemented to set the output current 120 dependent on the input voltage V10. Further, the variation of the output voltage V20 can be reduced by variation of the input voltage V10, since the threshold level 48, 50 are dependent on the input voltage V10, in particular the threshold level 48, 50 is increasing when the input voltage V10 is decreasing and the threshold level 48, 50 is decreasing when the input voltage V10 is increasing.

Conclusively, the embodiments of the driver device 10 shown in FIGS. 5 and 6 provide a linear dependency of the output current from the on-time duration of the time controllable switch 20, 22 and the time control unit 110 in combination with these embodiments of the driver device 10 provide a linear dependency of the output current from the input voltage V10.

Hence, a precise control of the electrical power provided to the load 18 can be implemented with low technical effort.

While the invention has been illustrated and described in detail in the drawings and foregoing description, such illustration and description are to be considered illustrative or exemplary and not restrictive; the invention is not limited to the disclosed embodiments. Other variations to the disclosed embodiments can be understood and effected by those skilled in the art in practicing the claimed invention, from a study of the drawings, the disclosure, and the appended claims.

In the claims, the word "comprising" does not exclude other elements or steps, and the indefinite article "a" or "an" does not exclude a plurality. A single element or other unit may fulfill the functions of several items recited in the claims. The mere fact that certain measures are recited in mutually different dependent claims does not indicate that a combination of these measures cannot be used to advantage.

A computer program may be stored/distributed on a suitable medium, such as an optical storage medium or a solid-state medium supplied together with or as part of other hardware, but may also be distributed in other forms, such as via the Internet or other wired or wireless telecommunication systems.

Any reference signs in the claims should not be construed as limiting the scope.

The invention claimed is:

1. A driver device for driving a load, the driver device comprising:
input terminals for connecting the driver device to a voltage supply and for receiving an input voltage from the voltage supply,
an output terminal for connecting the driver device to the load,
an electromagnetic converter for converting a drive voltage to an output voltage for powering the load,
two switches connected to the input terminals for providing a variable voltage as the drive voltage to the electromagnetic converter, and
a controller for controlling;
a first of the two switches, on the basis of an electrical signal measured at the electromagnetic converter and a threshold level, such that switching of the first switch is triggered by a level of the signal crossing the threshold level, and
a second of the two switches on the basis of a control parameter that controls on-times of the two switches to have independent durations.

2. The driver device as claimed in claim 1, wherein:
the controller is configured to switch the two switches alternatingly,
one of the two switches is assigned to a high voltage level and the other of the two switches is assigned to a low voltage level, and
the two switches provide a high voltage or a low voltage to the electromagnetic converter.

3. The driver device as claimed in claim 1, wherein the threshold level is a first threshold voltage, the control parameter is a second threshold voltage, and the first and second threshold voltages are set to different absolute values.

4. The driver device as claimed in claim 1, wherein the control parameter is the on-time duration of the second switch.

5. The driver device as claimed in claim 4, wherein the threshold voltage is an upper threshold level for controlling the first switch and the on-time duration of the second controllable switch is controlled by the controller.

6. The driver device as claimed in claim 4, wherein the threshold voltage is a lower threshold level for controlling the first switch and the on-time duration of the second switch is controlled by the controller.

7. The driver device as claimed in claim 1, further comprising:
a measurement device including a coupling member coupled to the electromagnetic converter,
first measurement circuitry having a full bridge rectifier connected to the coupling member for measuring a first voltage, and
second measurement circuitry having a half bridge rectifier connected to the coupling member for measuring a second voltage.

8. A driver device for driving a load, the driver device comprising:
input terminals for connecting the driver device to a voltage supply and for receiving an input voltage,
an output terminal for connecting the driver device to the load,
an electromagnetic converter for converting a drive voltage to an output voltage for powering the load, and
a measurement device including:
a coupling member coupled to the electromagnetic converter,
first measurement circuitry having a full bridge rectifier connected to the coupling member for measuring a first voltage, and
second measurement circuitry having a half bridge rectifier connected to the coupling member for measuring a second voltage.

9. The driver device as claimed in claim 7, wherein the coupling member comprises a winding coupled to the electromagnetic converter.

10. The driver device as claimed in claim 7, wherein:
the electromagnetic converter comprises a primary winding and first and second secondary winding for providing the output voltage to the load,
the first voltage measured by the first measurement circuitry corresponds to a combination of secondary voltages provided by the first and the second secondary windings, and
the second voltage measured by the second measurement circuitry corresponds to a secondary output voltage provided by the first secondary winding.

11. The driver device as claimed in claim 10, wherein the measurement device is configured to determine an output voltage provided by the second secondary winding on the basis of the first voltage and the second voltage.

12. The driver device for driving a load, according to claim 1, further comprising:
a single rectifier unit connected to the electromagnetic converter, wherein
the rectifier unit is configured to provide a half wave rectified voltage as the output voltage to the load.

13. The driver device as claimed in claim 12, wherein the rectifier unit is a half bridge rectifier for providing the output voltage to the load for powering the load.

14. The driver device as claimed in claim 13, wherein the controller comprises a time control device connected to one of the input terminals for controlling the on-time duration of the second switch on the basis of the input voltage.

15. A driving method for driving a load, the method comprising:
controlling two switches to provide a variable voltage as a drive voltage to an electromagnetic converter, and
converting, with the electromagnetic converter, the drive voltage to an output voltage for powering the load, wherein:
a first of the two switches is controlled on the basis of an electrical signal measured at the electromagnetic converter and a threshold level such that switching of the first switch is triggered by a level of the signal crossing the threshold level, and
a second of the two switches is controlled on the basis of a control parameter that controls on-times of the two switches to have independent durations.

16. The method of claim 15, wherein the control parameter identifies a predetermined amount of time after the first switch is turned off before the second switch is turned on.

17. The method of claim 15, wherein the control parameter identifies a predetermined amount of time for turning-on the second switch.

18. The method of claim 15, wherein the control parameter identifies another threshold level, differing from the threshold level, through which the signal level must cross to trigger the second switch.

\* \* \* \* \*